(12) United States Patent
Chen

(10) Patent No.: US 8,895,448 B2
(45) Date of Patent: Nov. 25, 2014

(54) SINGLE CRYSTAL SILICON MEMBRANE WITH A SUSPENSION LAYER, METHOD FOR FABRICATING THE SAME, AND A MICRO-HEATER

(75) Inventor: Chung-Nan Chen, New Taipei (TW)

(73) Assignee: National Kaohsiung University of Applied Sciences, Kaohsiung (TW)

( * ) Notice: Subject to any disclaimer, the term of this patent is extended or adjusted under 35 U.S.C. 154(b) by 154 days.

(21) Appl. No.: 13/482,020

(22) Filed: May 29, 2012

(65) Prior Publication Data

US 2013/0062738 A1    Mar. 14, 2013

(30) Foreign Application Priority Data

Sep. 9, 2011    (TW) .............................. 100132510 A

(51) Int. Cl.
*H01L 21/302* (2006.01)
*H01L 21/461* (2006.01)
*H05B 3/14* (2006.01)
*B81C 1/00* (2006.01)

(52) U.S. Cl.
CPC ..... *B81C 1/00158* (2013.01); *B81C 2201/0136* (2013.01); *H05B 3/141* (2013.01); *B81C 1/00595* (2013.01)
USPC .......................................... 438/705; 257/627

(58) Field of Classification Search
CPC ....................................................... H01L 29/045
USPC .......................................... 438/705; 257/627
See application file for complete search history.

(56) References Cited

U.S. PATENT DOCUMENTS

| | | | |
|---|---|---|---|
| 5,116,457 A | 5/1992 | Jerman | |
| 5,683,546 A * | 11/1997 | Manaka | ............................ 216/2 |
| 6,171,510 B1 * | 1/2001 | Lee | ................................ 216/27 |
| 6,557,967 B1 * | 5/2003 | Lee | ................................ 347/20 |

* cited by examiner

*Primary Examiner* — Thien F Tran
(74) *Attorney, Agent, or Firm* — Alan Kamrath; Kamrath IP Lawfirm, P.A.

(57) ABSTRACT

To form a single crystal silicon membrane with a suspension layer, a single crystal silicon substrate with crystal orientation <111> is prepared. A doped layer is formed on the top surface of the single crystal silicon substrate. Multiple main etching windows are formed through the doped layer. A cavity is formed through the single crystal silicon substrate by anisotropic etching. The doped layer is above the cavity to form a suspension layer. If two electrode layers are formed on the two ends of the suspension layer, a micro-heater is constructed. The main etching windows extend in parallel to a crystal plane {111}. By both the single crystal structure and different impurity concentrations of the single crystal silicon substrate, the single crystal silicon substrate has a higher etch selectivity. When a large-area cavity is formed, the thickness of the suspension layer is still controllable.

12 Claims, 6 Drawing Sheets

SINGLE CRYSTAL SILICON MEMBRANE WITH A SUSPENSION LAYER, METHOD FOR FABRICATING THE SAME, AND A MICRO-HEATER

BACKGROUND OF THE INVENTION

1. Field of the Invention

The present invention relates to a single crystal silicon membrane, and more particularity to a single crystal silicon membrane with a suspension layer, a method for fabricating the same and a micro-heater.

2. Description of Related Art

Forming a suspension layer in a silicon substrate may use a heavily doped etching stop technique. With reference to U.S. Pat. No. 5,116,457, a heavily doped layer is formed on a silicon substrate, and multiple etching windows are formed on the heavily doped layer. First, the silicon substrate is immersed into an anisotropic etching solution. The etch rate of the undoped silicon substrate in the anisotropic etching solution is much faster than that of heavily doped silicon layer, and the etch selectivity of undoped silicon to heavily doped silicon is typically around 50. By this characteristic, the anisotropic etching solution will remove a non-heavily doped silicon substrate region through the etching windows to form a cavity. Because the etch rate of the undoped silicon substrate is much faster than that of heavily doped silicon layer, the doped layer could be preserved above the cavity to become the suspension layer. The ability to form the suspension layer is proportional to the etch selectivity of the silicon substrate to the suspension layer.

In general, a micro-heater is a suspension layer-based component which has high thermal isolation. A silicon micromachined micro-heater with a large heating area needs a big cavity, so a longer wet etching time is needed to form the big cavity. Even though the etch rate of the heavily doped silicon layer is slower than that of non-heavily doped region in an anisotropic etching solution, if the etching time is too long, the suspension layer will be over etched and the thickness of the suspension layer is difficult to control. One of the most critical technology of fabricating a silicon suspension layer is the enhancement of the etch selectivity of silicon substrate to suspension silicon layer.

SUMMARY OF THE INVENTION

The present invention relates to a fabricating method for a single crystal silicon membrane with a suspension layer. When the method is especially used in the fabrication of a silicon suspension membrane with a large heating area, the damage of the silicon suspension layer could be highly lowered and the thickness of the silicon suspension layer could be well controlled.

The fabricating method in accordance with the present invention comprises the following steps:

preparing a single crystal silicon substrate with a crystal orientation <111>;

performing a heavy doping on a top surface of the single crystal silicon substrate to form a doped layer;

forming multiple main etching windows in the doped layer, wherein the main etching windows extend in parallel to a crystal plane {111}; and anisotropically etching the single crystal silicon substrate to form a cavity in the single crystal silicon substrate, wherein the doped layer above the cavity is regarded as a suspension layer.

The present invention also relates to a single crystal silicon membrane with a suspension layer. The single crystal silicon membrane comprises a single crystal silicon substrate with a crystal orientation <111>, a doped layer, multiple main etching windows and a cavity.

The single crystal silicon has a surface. The doped layer is formed on the surface of the single crystal silicon substrate. The multiple main etching windows are formed through the doped layer and extend in parallel to a crystal plane {111}. The cavity is formed in the single crystal silicon substrate and communicates with the main etching windows. The doped layer above a cavity is regarded as a suspension layer.

The present invention further relates to a micro-heater comprising a single crystal silicon substrate with a crystal orientation <111>, a doped layer, multiple main etching windows, a cavity and two opposite electrode layers.

The single crystal silicon substrate has a surface. The doped layer is formed on the surface of the single crystal silicon substrate. The multiple main etching windows are formed through the doped layer and extend in parallel to a crystal plane {111}. The cavity is formed in the single crystal silicon substrate and communicates with the main etching windows. The doped layer above the cavity is regarded as a suspension layer, wherein the suspension layer has two opposite ends. The two electrode layers are formed on the surface of the doped layer and located at the opposite ends of the suspension layer respectively.

According to the present invention, when the cavity is being etched, the etch rate of the doped layer is slower than that of the undoped single crystal silicon substrate. The etch selectivity of undoped silicon to heavily doped silicon $S_{undoped/doped}$ depends on the process parameters and etchant composition. At the same time, the horizontal etch rate of single crystal silicon is much higher than the vertical etch rate of the single crystal silicon due to the etching dependence on the crystalline orientation and the arrangement design of main etching windows in the present invention. The etch selectivity of horizontal etch rate to vertical etch rate $S_{horizontal/vertical}$ could be roughly expressed by the etch selectivity of <100>-oriented silicon to <111>-oriented silicon $S_{<100>/<111>}$. According to the combination of the etching characteristics of doped silicon and the crystal orientation of the single crystal silicon substrate, the etch selectivity of silicon in the cavity region to suspension silicon layer could be highly improved to $S_{undoped/doped} \times S_{horizontal/vertical}$. Choosing a better etch selectivity can control the area of the cavity and the thickness of the doped layer and prevent the doped layer from being over etched. Using this method is good for forming a large-area cavity.

DETAILED DESCRIPTION OF PREFERRED EMBODIMENT

Figure 1A:
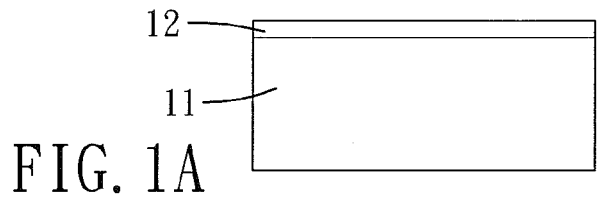
FIGS. 1A to 1E are flowcharts of a single main etching window of this invention.

With reference to FIG. 1A, a single crystal silicon substrate 11 with a crystal orientation <111> has a doped layer 12 formed on a top surface of the single crystal silicon substrate 11. In this embodiment, the doped layer 12 is formed on the top surface of the surface of the single crystal silicon substrate 11 by implanting impurity ions into the single crystal silicon substrate 11 or by a diffusion process, wherein the ions are selected from oxygen, boron or borofluoride. Impurity concentration of the doped layer 12 is higher than $10^{19} cm^{-3}$.

Figure 1B:
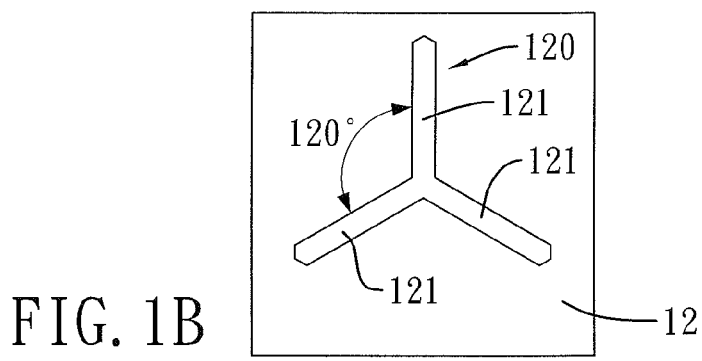
Figure 1C:
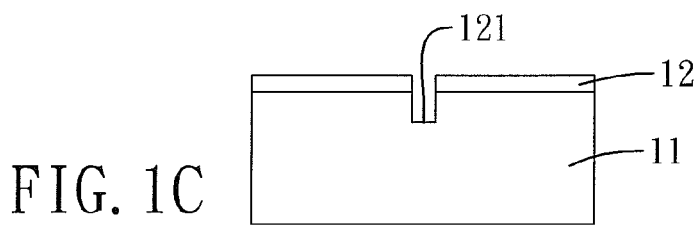

With reference to FIG. 1B and FIG. 1C, a main etching window 120 is formed through the doped layer 12. The main etching window 120 extends in parallel to a crystal plane {111}. The main etching window 120 could have three straight grooves 121. Each straight groove 121 has a depth more than the thickness of the doped layer 12. The depth of each straight groove 121 decides a depth of a cavity in the following steps.

Each of the straight grooves 121 has two ends. One end of each of the three straight grooves 121 communicates with each other. The other end of each straight groove 121 is a free end. With reference to FIG. 1B, an included angle between adjacent straight grooves 121 can be 120 degrees. The three straight grooves 121 are arranged in a radiation pattern. The extending direction of the straight grooves 121 is in parallel to the crystal plane {111}. Before the main etching window 120 is formed, a patterned mask layer could be formed on the doped layer 12. The patterned mask layer will decide shapes of the main etching windows 120. And then, by the dry etching process, such as plasma etching, uncovered region of the doped layer 12 will become the main etching window 120. After the main etching window 120 is formed, the mask layer is then removed.

Figure 1D:
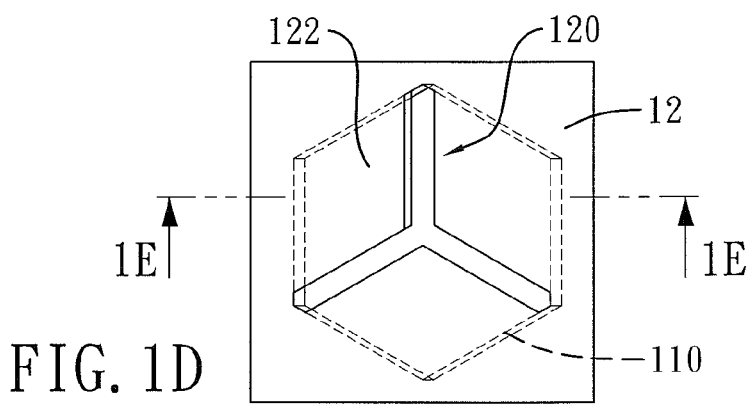
Figure 1E:
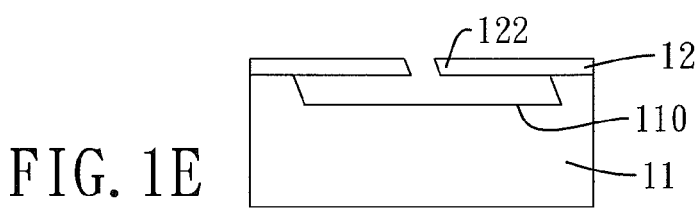

With reference to FIG. 1D and FIG. 1E, the single crystal silicon substrate 11 is immersed in the liquid etchant, for example, Tetra Methyl Ammonium Hydroxide (TMAH), to be anisotropically etched. Because the doped layer 12 has a higher impurity concentration and the main etching window 120 extends in parallel to a crystal plane {111}, the etch rate of the doped layer 12 is much slower than that of the undoped region of the single crystal silicon substrate 11 due to the etch-stop effects of heavy doping and crystalline orientation. With the crystal orientation structure <111> of the single crystal silicon substrate 11, the horizontal etch rate is higher than the vertical etch rate in the single crystal silicon substrate 11. After an anisotropic etching process, a cavity 110 is formed through the single crystal silicon substrate 11 and shaped into a circumscribed hexagon with six {111} crystalline planes. The doped layer 12 above the cavity 110 is regarded as a suspension layer 122.

Figure 2A:
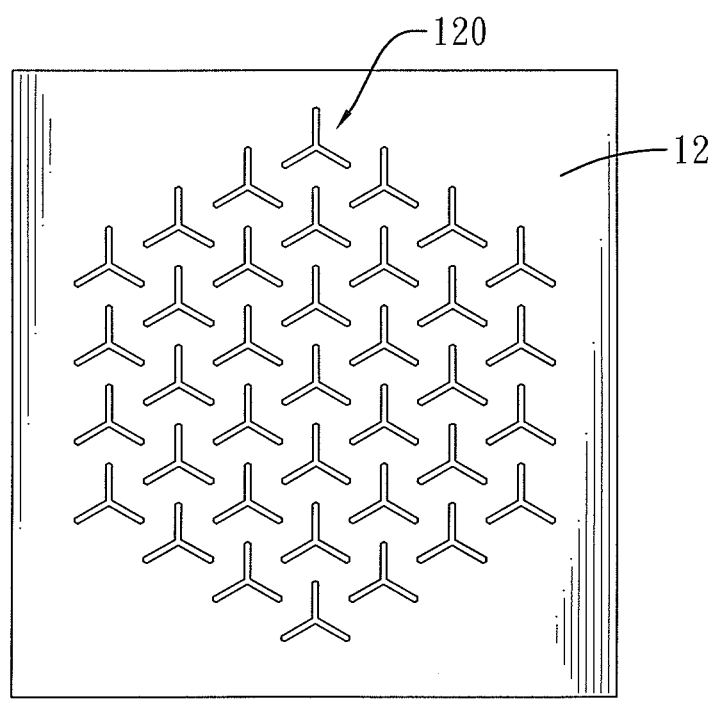
FIGS. 2A to 2C are flowcharts of multiple main etching windows of this invention.
Figure 2B:
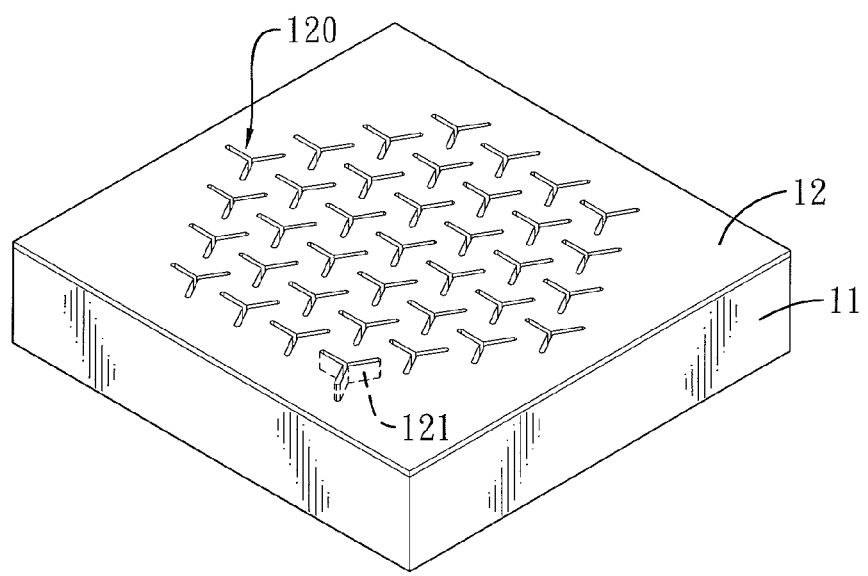
Figure 2C:
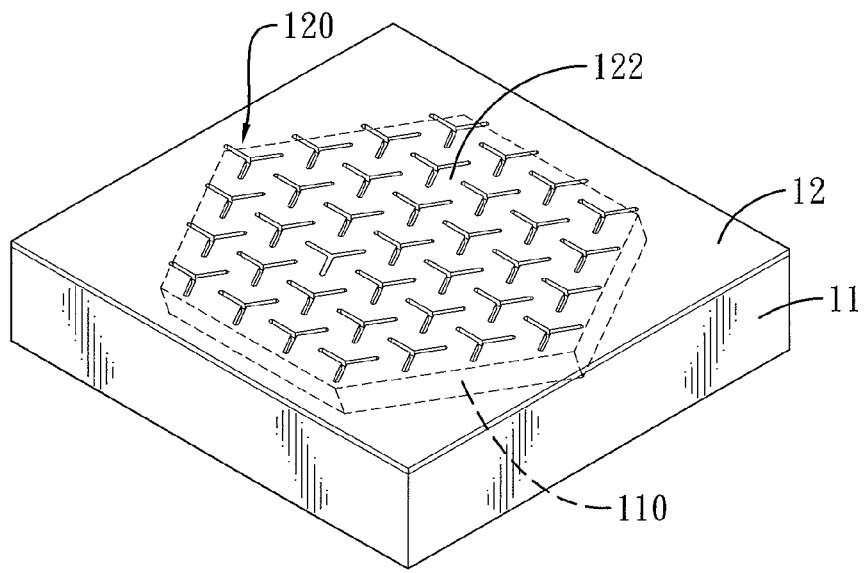

FIG. 2A to FIG. 2C show the formation of a large-area suspension layer and a cavity in the single crystal silicon substrate 11. First of all, the multiple main etching windows 120 are formed and arranged into a hexagon. And then, the single crystal silicon substrate 11 is anisotropically etched. Liquid etchant forms through the main etching windows 120 and flows into the single crystal silicon substrate 11 to form a cavity 110. Each of the main etching windows 120 communicates with the cavity 110, which is a hexagon confined by six {111} crystalline planes. The doped layer 12 above the cavity 110 is regarded as the suspension layer 122.

Figure 3A:
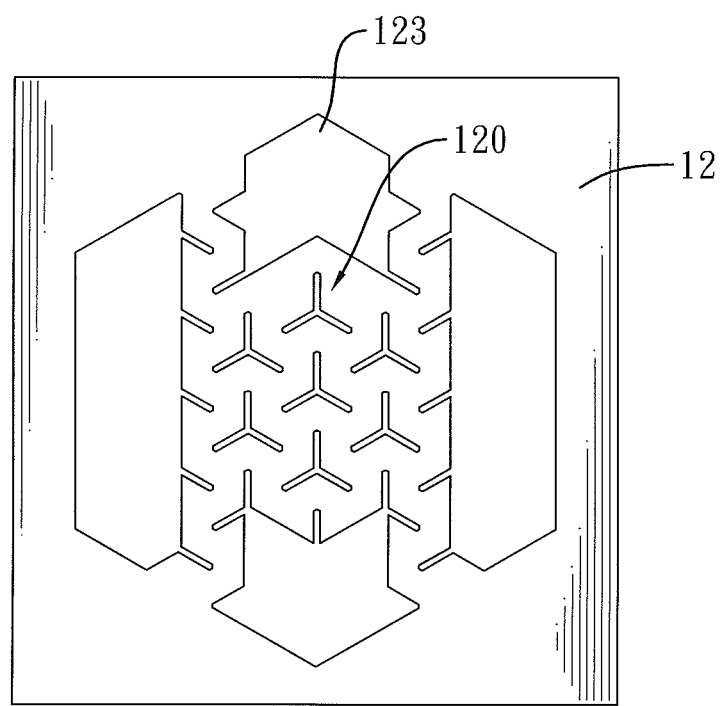
FIGS. 3A to 3C are flowcharts of multiple etching windows of this invention.
Figure 3B:
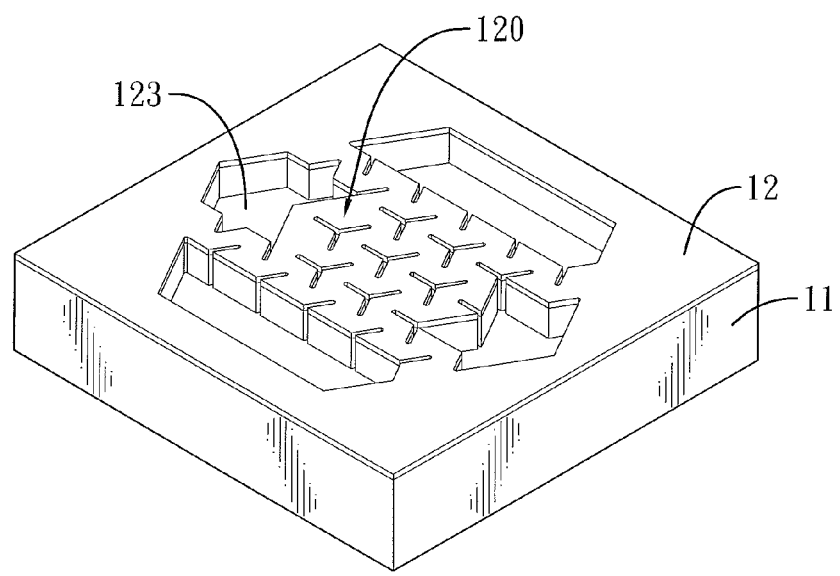
Figure 3C:
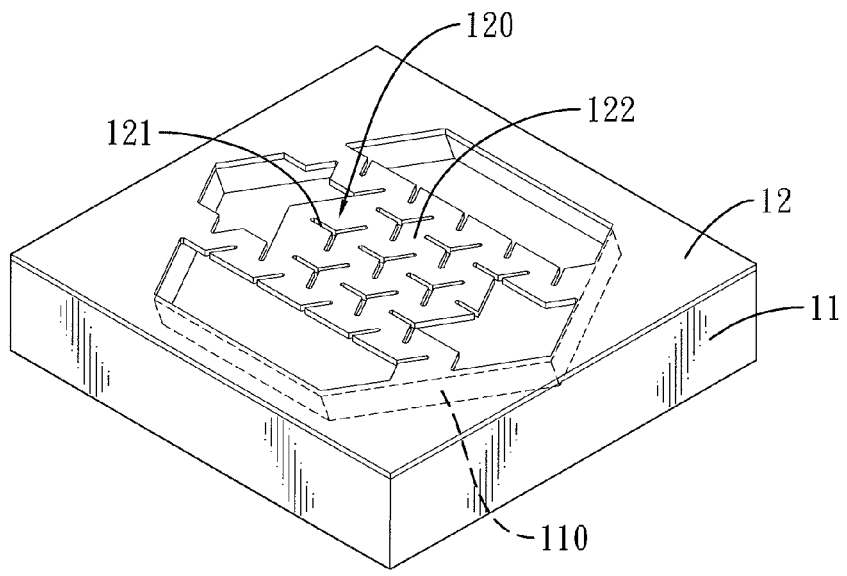

FIGS. 3A to 3C show a second embodiment of the suspension layer. At first, multiple main etching windows 120 are formed on the surface of the doped layer 12. Four surrounding etching windows 123 are arranged separately and oppositely into a hexagon. Each side of the etching windows 123 is parallel to the crystal plane {111} in order to enhance etch selectivity. The multiple main etching windows 120 are surrounded by the surrounding etching windows 123. The depth of each surrounding etching window 123 is the same as the depth of the main etching windows 120. The single crystal silicon substrate 11 is anisotropically etched by liquid etchant through the main etching windows 120 and the surrounding etching windows 123. The cavity 110 is formed through the single crystal silicon substrate 11. The cavity 110 is hexagonal. The doped layer 12 above the cavity 110 is regarded as the suspension layer 122.

From all of the above descriptions and with reference to FIG. 2C, a single crystal silicon membrane structure with a suspension layer includes the single crystal silicon substrate 11 and the cavity 110. The crystal orientation of the single crystal silicon substrate 11 is <111>. The doped layer 12 is formed on the surface of the single crystal silicon substrate 11. The multiple main etching windows 120 are formed in the doped layer 12. The main etching windows 120 could be three straight grooves 121. One end of each of the three straight grooves 121 is connected together. The extending direction of the straight grooves 121 is in parallel to the crystal plane {111}.

The cavity 110 is formed in the single crystal silicon substrate 11. The cavity 110 communicates with the main etching windows 120. The doped layer 12 above the cavity 110 is regarded as a suspension layer 122.

Figure 4A:
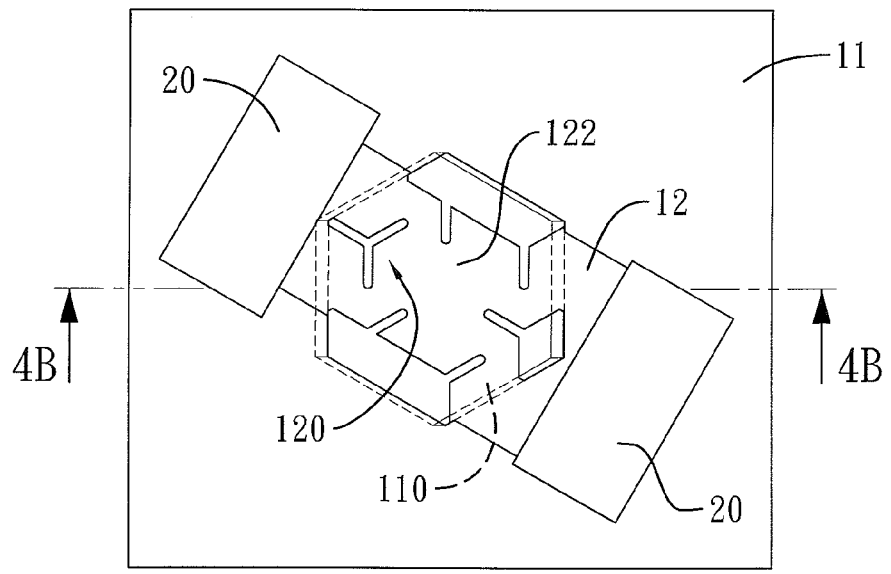
FIG. 4A is a plane graph of a micro-heater.
Figure 4B:
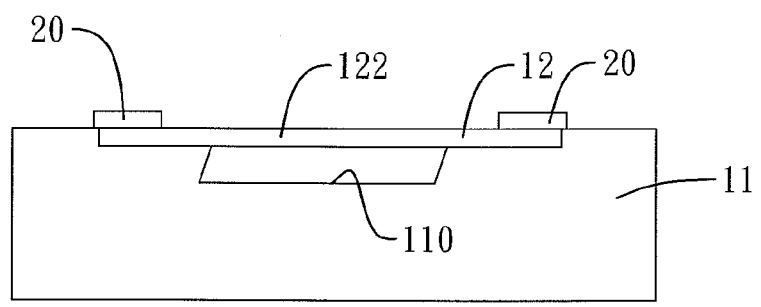
FIG. 4B is a cross-sectional view of FIG. 4A.

With reference to FIG. 4A and FIG. 4B, a micro-heater of the present invention is shown. Following the second embodiment, two opposite electrode layers 20 are formed on the surface of the doped layer 12 before the main etching windows 120 are etched. After the process, the two electrode layers 20 are located in the two opposite ends of the suspension layer 122. The two electrode layers 20 are adapted to connect to a power source. When a current passes through the suspension layer 122, heat will be generated in the suspension layer 122.

To summarize all of the above, during the etching process in this invention, because the doped layer 12 has a higher impurity concentration, the etch rate of the doped layer 12 is much slower than that of the undoped layer of the single crystal silicon substrate 11. Also, with the crystal orientation structure <111> of the single crystal silicon substrate 11, the horizontal etch rate is much higher than the vertical etch rate in the single crystal silicon substrate 11. With the two characteristics above, the etch selectivity of the single crystal silicon substrate 11 to the doped layer 12 could be improved from $S_{undoped/doped}$ to $S_{undoped/doped} \times S_{horizontal/vertical}$. Because the single crystal silicon substrate 11 has a high etch selectivity, when the single crystal silicon substrate is etched, the cavity 110 and the thickness of the doped layer 12 above the cavity 110 will be controlled precisely.

What is claimed is:

1. A method for fabricating a single crystal silicon membrane with a suspension layer comprising:
   preparing a single crystal silicon substrate with a crystal orientation <111>;
   performing a heavy doping on a top surface of the single crystal silicon substrate to form a doped layer;
   forming multiple main etching windows in the doped layer, wherein the main etching windows extend in parallel to a crystal plane {111}; and
   anisotropically etching the single crystal silicon substrate to form a cavity in the single crystal silicon substrate, wherein the doped layer above the cavity is regarded as a suspension layer.

2. The method as claimed in claim 1, wherein in forming the multiple main etching windows in the doped layer, a depth of the cavity is decided by a depth of the main etching windows.

3. The method as claimed in claim 2, wherein the doped layer has an impurity concentration greater than $1019\ cm^{-3}$.

4. The method as claimed in claim 3, wherein each main etching window has three straight grooves, with one end of each of the straight grooves connected together, and wherein an extending direction of the straight grooves is in parallel to a crystal plane {111}.

5. The method as claimed in claim 4, wherein the doped layer contains oxygen, boron or borofluoride.

6. The method as claimed in claim 5, wherein in forming the multiple main etching windows in the doped layer, a patterned mask layer is formed on the doped layer for determining a shape of the multiple main etching windows; and then a dry etching process is applied to etch the doped layer uncovered by the patterned mask layer to form the multiple main etching windows.

7. The method as claimed in claim 6, wherein forming the multiple main etching windows in the doped layer further comprises forming multiple surrounding etching windows around the multiple main etching windows.

8. The method as claimed in claim 1, wherein the doped layer has an impurity concentration greater than $1019$ $cm^{-3}$.

9. The method as claimed in claim 8, wherein each main etching window has three straight grooves, with one end of each of the three straight grooves connected together, and wherein an extending direction of the straight grooves is in parallel to the crystal plane {111}.

10. The method as claimed in claim 9, wherein the doped layer contains oxygen, boron or borofluoride.

11. The method as claimed in claim 10, wherein in forming the multiple main etching windows in the doped layer, a patterned mask layer is formed on the doped layer for determining a shape of the multiple main etching windows; and then a dry etching process is applied to etch the doped layer uncovered by the patterned mask layer to form the multiple main etching windows.

12. The method as claimed in claim 11, wherein forming the multiple main etching windows in the doped layer further comprises forming multiple surrounding etching windows around the multiple main etching windows.

\* \* \* \* \*